(12) United States Patent
Behrends et al.

(10) Patent No.: US 7,525,367 B2
(45) Date of Patent: Apr. 28, 2009

(54) METHOD FOR IMPLEMENTING LEVEL SHIFTER CIRCUITS FOR INTEGRATED CIRCUITS

(75) Inventors: Derick Gardner Behrends, Rochester, MN (US); Todd Alan Christensen, Rochester, MN (US); Travis Reynold Hebig, Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 107 days.

(21) Appl. No.: 11/538,967

(22) Filed: Oct. 5, 2006

(65) Prior Publication Data

US 2008/0084237 A1    Apr. 10, 2008

(51) Int. Cl.
*H04L 5/00* (2006.01)
(52) U.S. Cl. .......................................... 327/333; 326/80
(58) Field of Classification Search ................. 327/318, 327/319, 323, 327, 328, 333; 326/62, 63, 326/80
See application file for complete search history.

(56) References Cited

U.S. PATENT DOCUMENTS

| | | | | |
|---|---|---|---|---|
| 5,223,751 A | * | 6/1993 | Simmons et al. ............... | 326/81 |
| 5,304,867 A | * | 4/1994 | Morris .......................... | 326/71 |
| 5,321,324 A | * | 6/1994 | Hardee et al. .................. | 326/62 |
| 5,541,546 A | * | 7/1996 | Okumura ..................... | 327/333 |
| 6,023,183 A | * | 2/2000 | Cao et al. ..................... | 327/333 |
| 6,043,699 A | * | 3/2000 | Shimizu ...................... | 327/333 |
| 6,163,170 A | * | 12/2000 | Takinomi ..................... | 326/81 |
| 6,232,818 B1 | * | 5/2001 | Zaliznyak .................... | 327/333 |
| 6,717,452 B2 | * | 4/2004 | Carpenter et al. ............ | 327/333 |
| 7,148,735 B2 | * | 12/2006 | Ito et al. ...................... | 327/333 |
| 7,290,186 B1 | | 10/2007 | Zorian et al. | |

* cited by examiner

*Primary Examiner*—Lincoln Donovan
*Assistant Examiner*—Hai L. Nguyen
(74) *Attorney, Agent, or Firm*—Joan Pennington

(57) ABSTRACT

A low power level shifter circuit includes an input inverter operating in a domain of a first voltage supply. The input inverter receives an input signal and provides a first inverted signal. An output inverter operating in a domain of a second voltage supply coupled to the input inverter and provides an output signal having a voltage level corresponding to the second voltage supply and a logic value corresponding to the input signal. The second voltage supply is higher than the first voltage supply. A leakage current control circuit includes a finisher transistor connected between the second voltage supply and the input to the output inverter and a path control transistor control a path between the first voltage supply and the input inverter.

3 Claims, 11 Drawing Sheets

US 7,525,367 B2

METHOD FOR IMPLEMENTING LEVEL SHIFTER CIRCUITS FOR INTEGRATED CIRCUITS

FIELD OF THE INVENTION

The present invention relates generally to the data processing field, and more particularly, relates to a method for implementing voltage level shifter circuits and low power level shifter circuits for integrated circuits.

DESCRIPTION OF THE RELATED ART

Level shifter circuits are utilized in integrated circuits for changing the voltage of a signal from a first voltage to a second voltage, such as from a high to a low operating voltage, or from a low to a high operating voltage.

As technology advances, scaling of the power supply voltage occurs for power reduction and reliability reasons. Certain types of circuits are more sensitive to this reduction in voltage such as analog, memory and input/output (I/O) circuits. To combat this, many chip designs have added extra power supply domains to use in these sensitive circuits.

Referring to FIGS. 1A, and 1B, there is shown a prior art circuit 100 including a first power supply voltage VDDA and a second higher power supply voltage VDDB. Circuit 100 includes a pair of inverters with an input inverter receiving an input signal and providing an output OUTPUT_B. The input inverter is defined by a series connected P-channel field effect transistor (PFET) 102 and an N-channel field effect transistor (NFET) 104 connected between the first power supply voltage VDDA and ground. An output inverter is defined by a series connected PFET 106 and NFET 108 connected between the second power supply voltage VDDB and ground.

The input inverter output OUTPUT_B is applied to the output inverter that provides an output signal OUTPUT.

As shown in FIGS. 1A, and 1B when static logic gates are connected normally at the interface between a lower VDDA and a higher VDDB, problems can result. For example, as illustrated in FIG. 1B as VDDB rises greater than a PFET threshold voltage above VDDA, the output inverter PFET 106 will turn on and DC current will flow through the output inverter gate connected to VDDB. This prevents a good zero level on the output node, as indicated by the label>0 at the OUTPUT in FIG. 1B.

Referring also to FIG. 2, the problem can be exacerbated with wider gates in which multiple PFETs could be turned on and leak DC current. FIG. 2 illustrates a prior art two-input NAND gate 200 including a pair of input inverters, defined by PFET 202 and NFET 204, and PFET 206 and NFET 208, receiving INPUT1 and INPUT2 and connected between the first power supply voltage VDDA and ground. NAND gate 200 includes PFET 210, NFET 212, and PFET 216, NFET 218 having a respective gate input connected to the respective common connection of PFET 202 and NFET 204, and PFET 206 and NFET 208 and providing output OUTPUT_B and operating in the domain of the second power supply voltage VDDB. OUTPUT_B is applied to the output inverter defined by PFET 220, NFET 222 that provides an output signal OUTPUT. When VDDB rises greater than a PFET threshold voltage above VDDA, each of the PFETs 210, 216, and NFET 222 can turn on leaking DC current.

FIG. 3 illustrates a prior art level shifter circuit 300. Level shifter circuit 300 includes an input inverter 302 connected to a first voltage supply domain VDD1 receiving an input signal IN. Level shifter circuit 300 includes a pair of cross-coupled PFETs 304, 306 respectively connected between a second voltage supply domain VDD2 and a respective NFET 308, 310. In operation with an input signal IN of logical 1, NFET 308 is turned on and input inverter 302 provides a logical 0, NFET 310 is turned off. PFET 306 is turned on driving the output OUT to VDD2 and PFET 304 turned off. With an input signal IN of logical 0, NFET 308 is turned off and input inverter 302 provides a logical 1, NFET 310 is turned on, driving the output OUT to logical 0 and PFET 304 turned on. The gate input to PFET 306 approaches VDD2 and PFET 306 is turned off.

Problems with many known level shifter circuits include degraded power and performance characteristics. For example, in the prior art level shifter circuit 300 shoot through current can result on both transitions from low to high and from high to low. Also prior art level shifter circuit 300 fails to enable high frequency operation that may be required for some particular applications.

A need exists for an effective mechanism for implementing voltage level shifters and low power level shifters for integrated circuits.

SUMMARY OF THE INVENTION

A principal aspect of the present invention is to provide a method for implementing voltage level shifters and low power level shifters for integrated circuits. Other important aspects of the present invention are to provide such method for implementing voltage level shifters and low power level shifters for integrated circuits substantially without negative effect and that overcome many of the disadvantages of prior art arrangements.

In brief, a method for implementing voltage level shifter circuits and low power level shifter circuits are provided for integrated circuits. A low power level shifter circuit includes an input inverter operating in a domain of a first voltage supply. The input inverter receives an input signal and provides a first inverted signal. An output inverter operating in a domain of a second voltage supply coupled to the input inverter and provides an output signal having a voltage level corresponding to the second voltage supply and a logic value corresponding to the input signal. The second voltage supply is higher than the first voltage supply. A leakage current control circuit includes a finisher transistor connected between the second voltage supply and the input to the output inverter and a path control transistor controlling a path between the first voltage supply and the input inverter.

In accordance with features of the invention, the level shifter circuit enables enhanced power and performance characteristics. The level shifter circuit reduces overall shoot through current while limiting shoot through current to one transition. The level shifter circuit enables reduced fan-in. The level shifter circuit is implemented with various static logic circuits, such as NAND level shifter gates and NOR level shifter gates.

In accordance with features of the invention, the finisher transistor is activated to provide the voltage level corresponding to the second voltage supply to the input to the output inverter and the path control transistor is turned off to open the path responsive to a one logic value of the first inverted signal.

In accordance with features of the invention, the finisher transistor is turned off responsive to a zero logic value of the first inverted signal and the path control transistor is activated to maintain the path between the first voltage supply and the input inverter.

In accordance with features of the invention, the finisher transistor is a P-channel field effect transistor (PFET) and the path control transistor is a PFET. In one embodiment, a gate of the finisher PFET is connected to the output of the output inverter of the level shifter circuit. The output of the output inverter is inverted and applied to a gate of the path control PFET. In another embodiment, a gate of the finisher PFET is connected by an inverter to the input of the output inverter of the level shifter circuit. The input of the output inverter is applied to a gate of the path control PFET. The input signal can be applied via an odd number of inverters to a gate of the path control PFET. The input of the output inverter can be applied via an even number of inverters to a gate of the path control PFET.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the invention, level shifter circuits are provided having excellent power and performance characteristics. The novel level shifter circuits reduce overall shoot through current while limiting shoot through current, for example, to one transition. The novel level shifter circuits also reduce fan-in. The method for implementing the level shifter circuits advantageously is applied to various static logic circuits, for example, NAND and NOR level shifter gates.

Figure 1A:
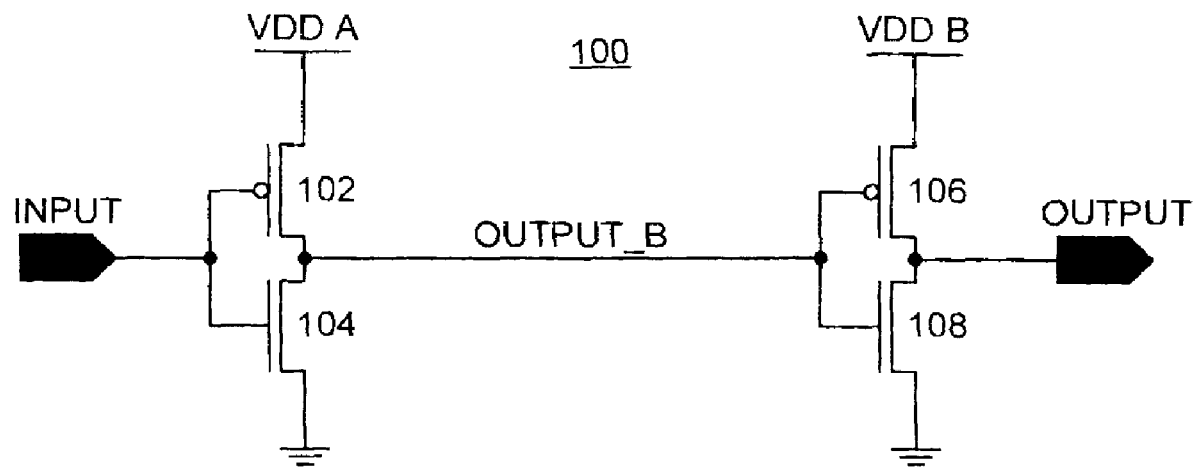
FIGS. 1A and 1B illustrate a prior art circuit including a first power supply voltage VDDA and a second higher power supply voltage VDDB.
Figure 1B:
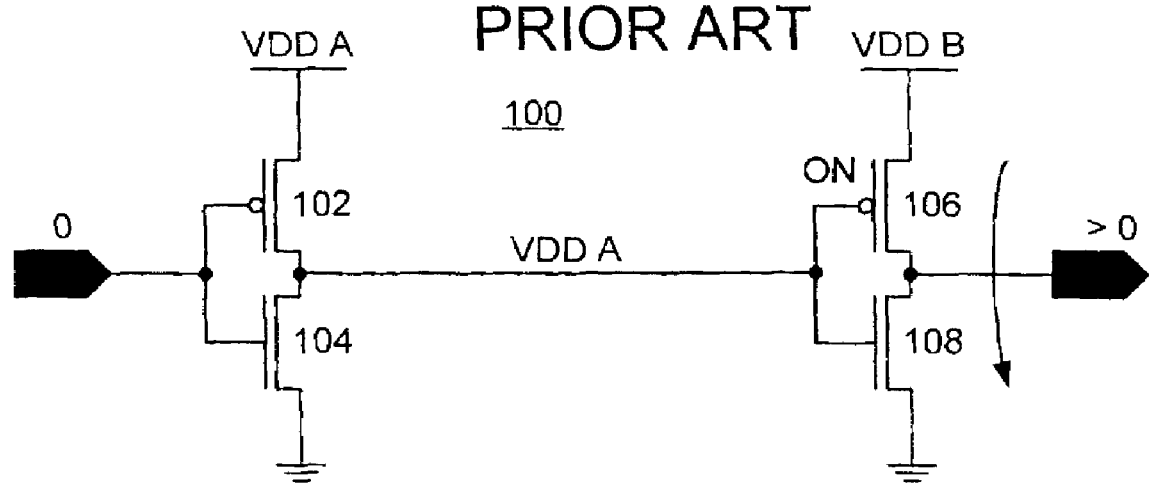
Figure 2:
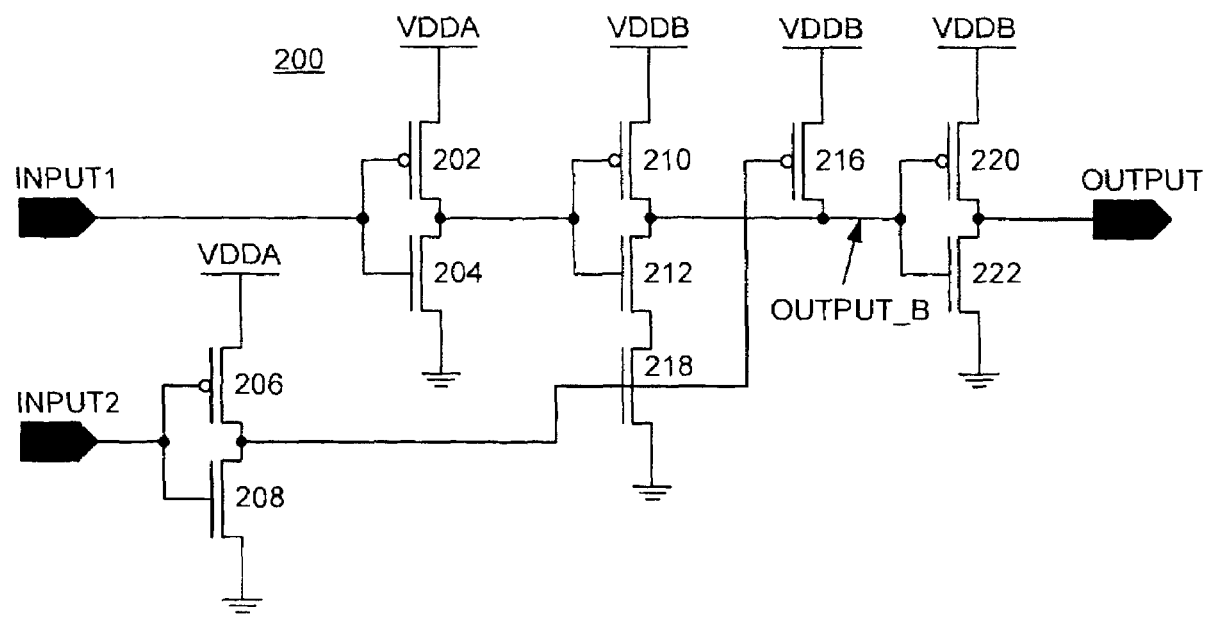
FIG. 2 illustrates a prior art NAND gate including a first power supply voltage VDDA and a second higher power supply voltage VDDB.
Figure 3:
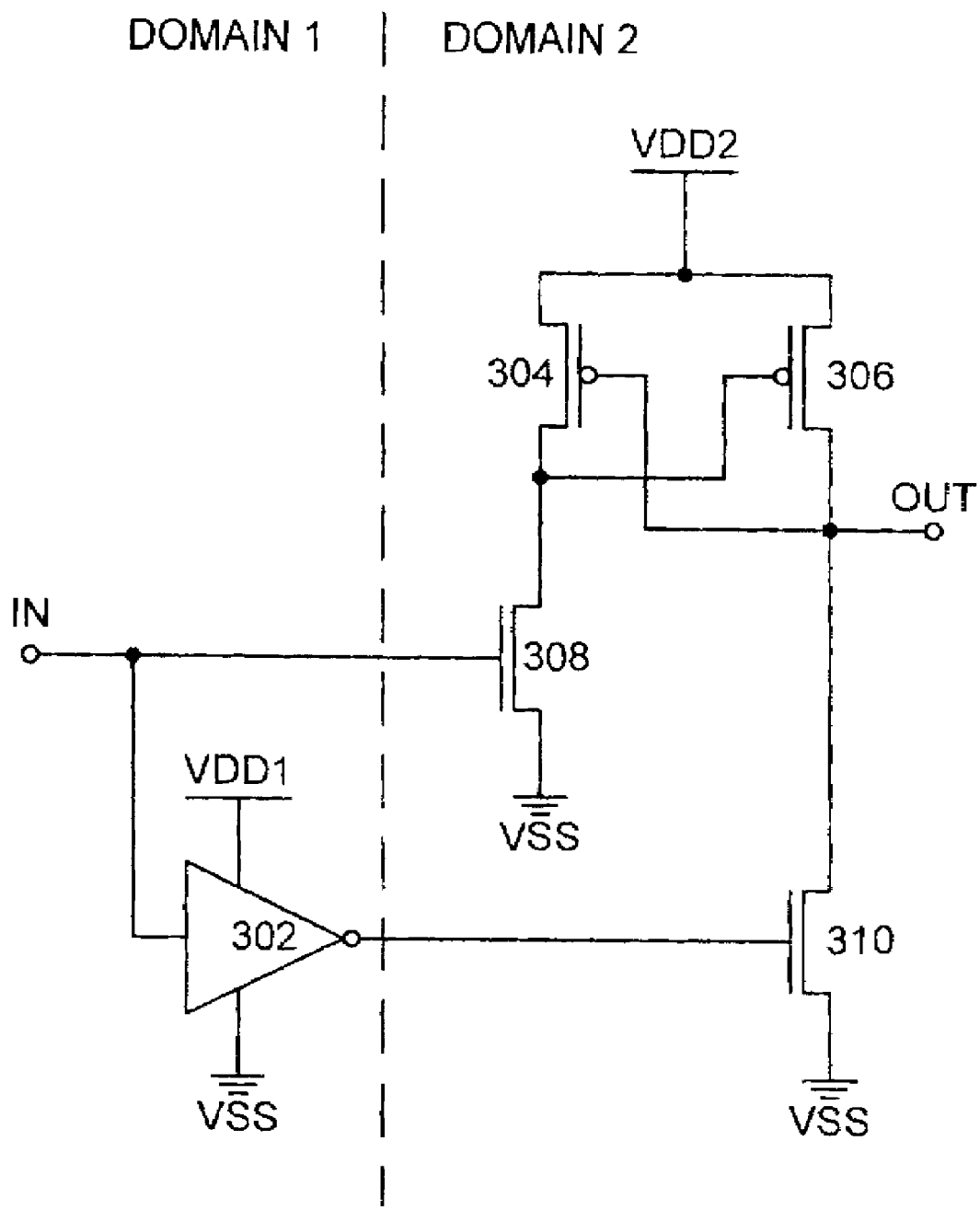
FIG. 3 illustrates a prior art level shifter circuit.
Figure 4A:
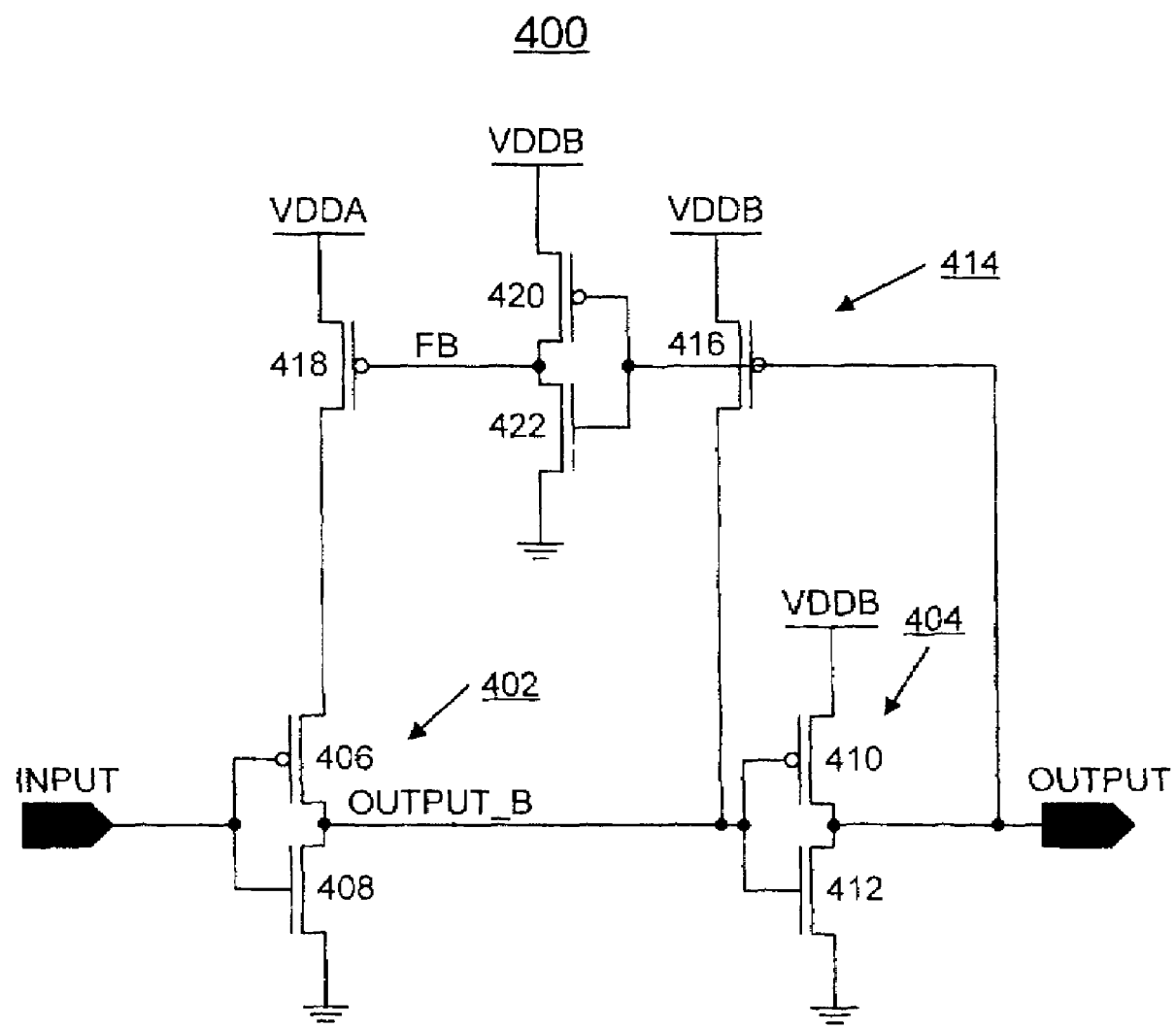
FIG. 4A is a schematic diagram illustrating an exemplary level shifter circuit in accordance with the preferred embodiment.

Having reference now to the drawings, in FIG. 4A there is shown an exemplary level shifter circuit generally designated by the reference character 400 in accordance with the preferred embodiment. Level shifter circuit 400 includes an input inverter 402 operating in a domain of a first power supply voltage VDDA. The input inverter receives an input signal INPUT and provides a first inverted signal OUTPUT_B. An output inverter 404 operating in a domain of a second power supply voltage VDDB coupled to the input inverter 402 that provides an output signal OUTPUT having a voltage level corresponding to the second voltage supply and a logic value corresponding to the input signal. The second power supply voltage VDDB is higher than the first power supply voltage VDDA.

The input inverter 402 is defined by a series connected P-channel field effect transistor (PFET) 406 and an N-channel field effect transistor (NFET) 408. The output inverter 404 is defined by a series connected PFET 410 and NFET 412 connected between the second power supply voltage VDDB and ground. The input inverter output OUTPUT_B is applied to the output inverter 404 that provides the output OUTPUT.

Level shifter circuit 400 includes a leakage current control circuit 414 including a finisher transistor 416 connected between the second power supply voltage VDDB and the input to the output inverter 404 and a path control transistor 418 controlling a path between the first power supply voltage VDDA and the input inverter 402. An inverter defined by a series connected PFET 420 and NFET 422 is connected between the second power supply voltage VDDB and ground having a common gate input connected to the OUTPUT and providing a gate input at a node FB to the path control PFET 418. The finisher PFET 416 has a gate input connected to the OUTPUT.

It should be understood that the present invention is not limited to the level shifter circuit 400 as shown. For example, the path control PFET 418 could be provided between PFET 406 and NFET 408, with PFET 406 connected to first power supply voltage VDDA.

Figure 4B:
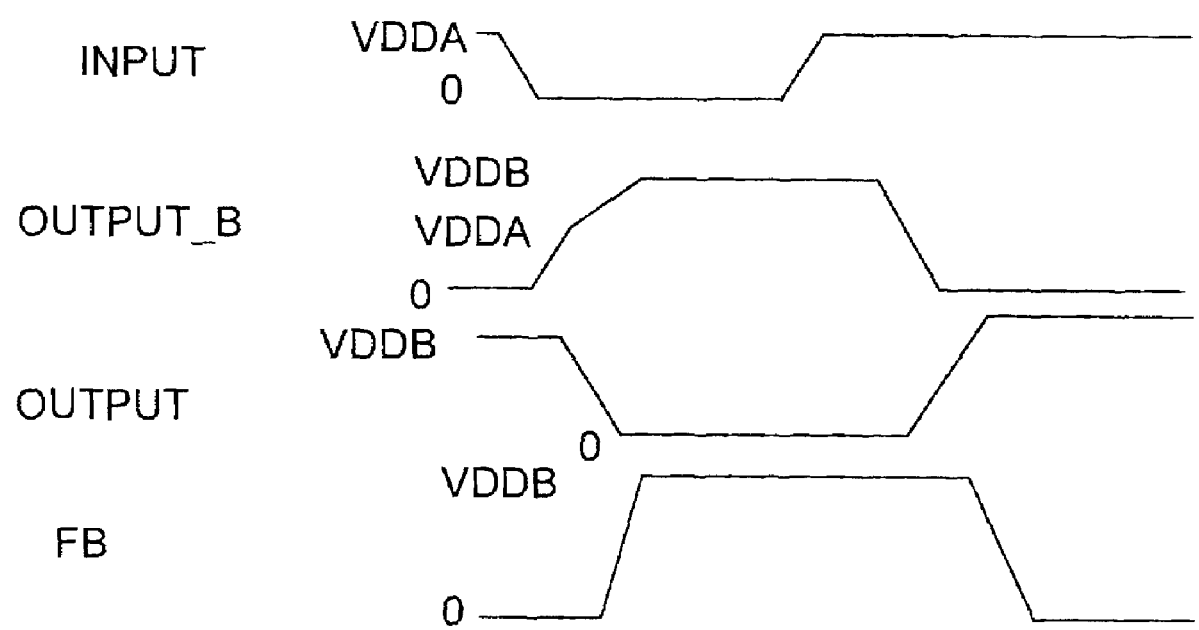
FIG. 4B illustrates exemplary waveforms of the level shifter circuit of FIG. 4A in accordance with the preferred embodiment.

Referring also to FIG. 4B, the operation of level shifter circuit 400 may be understood as follows. When the INPUT is a one logic value, such as at VDDA, OUTPUT_B is at ground (0V). OUTPUT is at the second voltage level VDDB, thus the finisher PFET 416 is off and FB is at 0 with the path control PFET 418 turned on to maintain the path between the first power supply voltage VDDA and the input inverter 402. When the INPUT goes to a zero logic value (0V), OUTPUT_B rises to the first voltage level VDDA, OUTPUT falls to 0V which turns on the finisher PFET 416 and FB rises to VDDB. The path control PFET 418 turned off so that the path from OUTPUT_B to VDDA on the input gate 402 is cut off and the finisher PFET 416 is fully activated, causing the rise of OUTPUT_B to VDDB. Thus, level shifter circuit 400 avoiding DC current flow problems of prior art arrangements that result when the second voltage level VDDB is greater than a PFET threshold voltage above the first voltage level VDDA.

Figure 5:
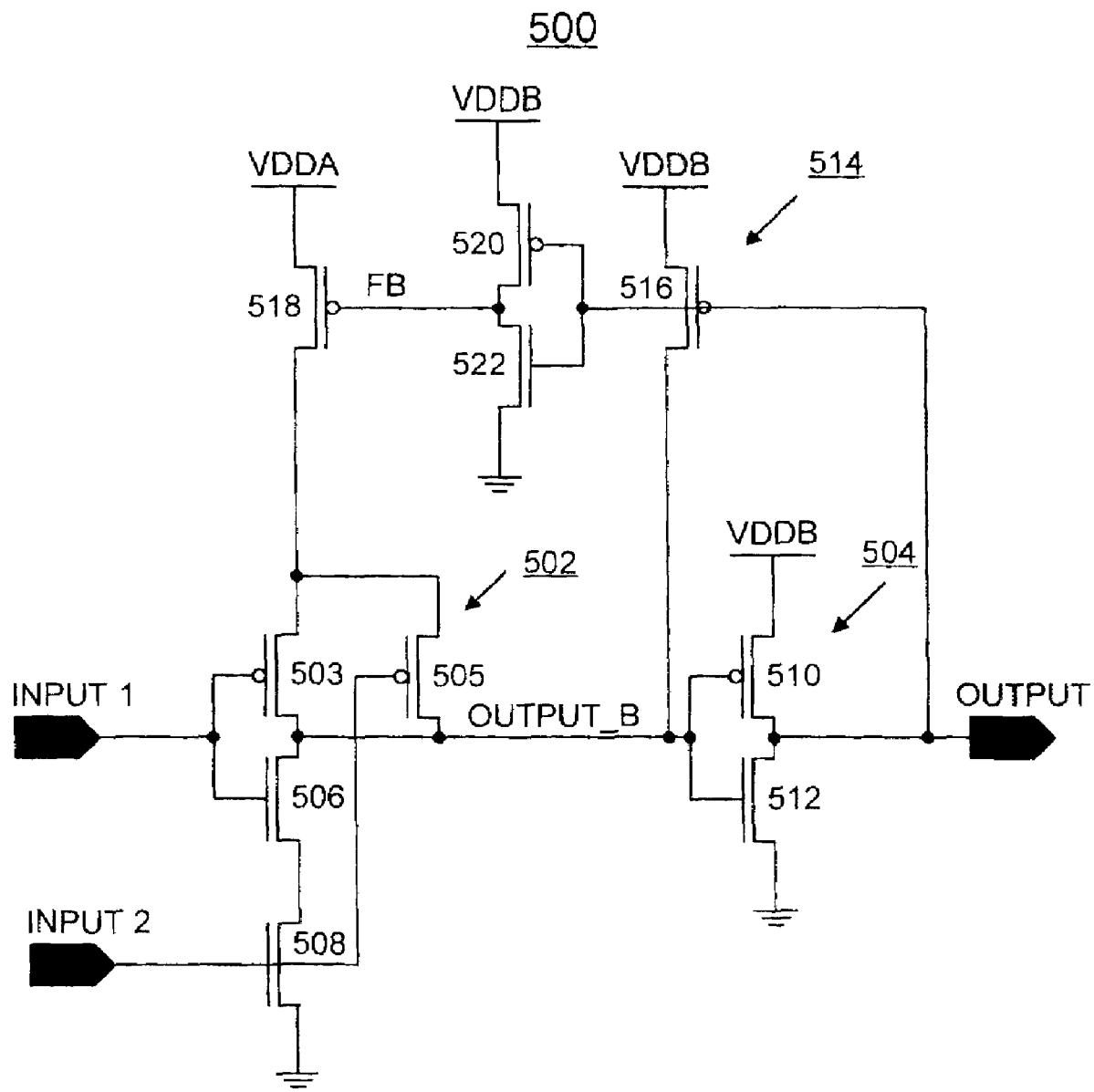
FIGS. 5, 6, 7, 8, 9 and 10 are schematic diagrams illustrating alternative level shifter circuits in accordance with the preferred embodiment.

Referring to FIG. 5, there is shown an exemplary level shifter circuit generally designated by the reference character 500 in accordance with the preferred embodiment. Level shifter circuit 500 is a two input NAND level shifter circuit including a NAND gate 502 operating in a domain of a first power supply voltage VDDA. The NAND gate 502 receives a respective input signal INPUT1, and input signal INPUT2, and provides a NAND signal OUTPUT_B. An output inverter 504 operating in a domain of a second power supply voltage VDDB is coupled to the NAND gate 502. The output inverter 504 provides an output signal OUTPUT having a voltage level corresponding to the second voltage supply and a logic value corresponding to the input signal. The second power supply voltage VDDB is higher than the first power supply voltage VDDA.

The NAND gate 502 is defined by a pair of PFETs 503 and 505 connected to a pair of series connected NFETs 506 and 508 that are connected between the drain of PFET 503 and ground. The output inverter 504 is defined by a series connected PFET 510 and NFET 512 connected between the second power supply voltage VDDB and ground. The NAND output OUTPUT_B is applied to the output inverter 504 that provides the output signal OUTPUT.

NAND level shifter circuit 500 includes a leakage current control circuit 514 including a finisher transistor 516 connected between the second power supply voltage VDDB and the input to the output inverter 504 and a path control transistor 518 controlling a path between the first power supply voltage VDDA and the NAND gate 502. An inverter defined by a series connected PFET 520 and NFET 522 is connected between the second power supply voltage VDDB and ground having a common gate input connected to the OUTPUT and providing a gate input to the path control PFET 518. The finisher PFET 516 has a gate input connected to the OUTPUT.

Operation of the leakage current control circuit 514 of NAND level shifter circuit 500 provides the same functions as the leakage current control circuit 414 of level shifter circuit 400.

Figure 6:
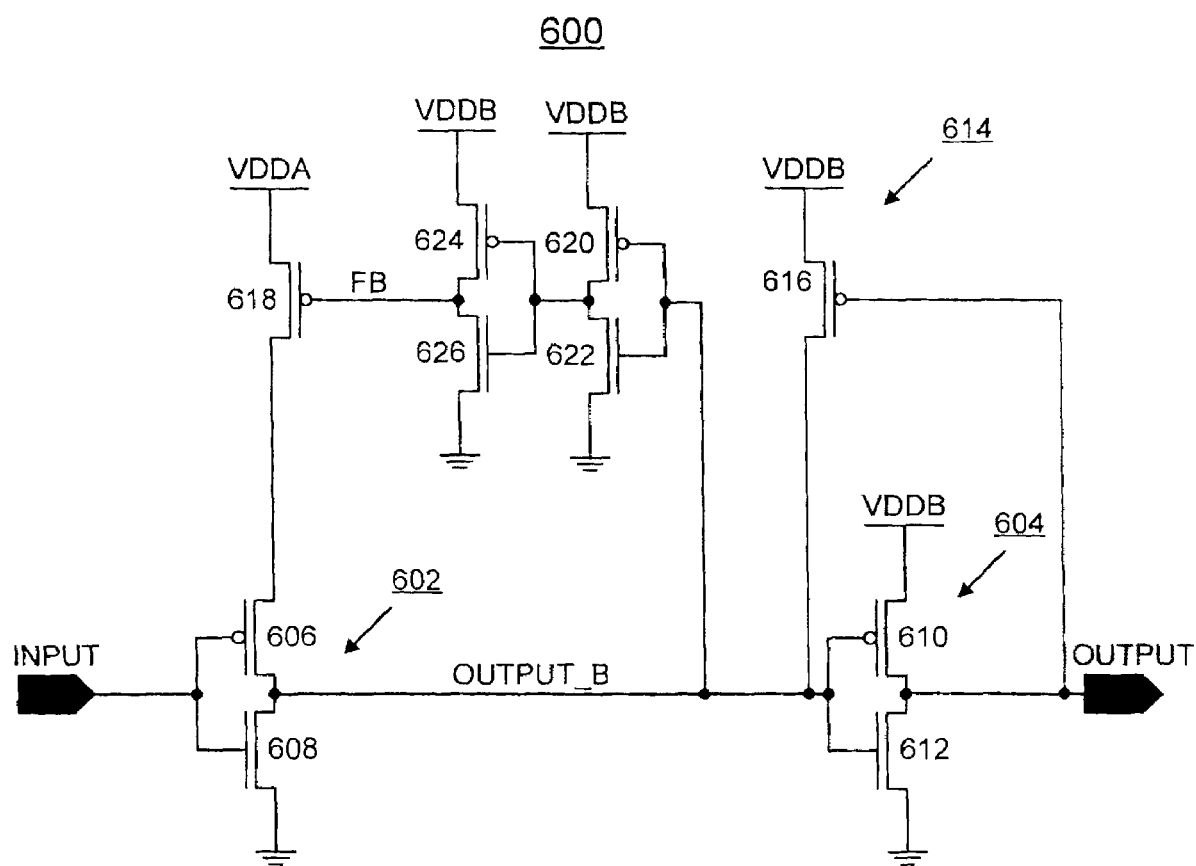

Referring to FIG. 6, there is shown another exemplary level shifter circuit generally designated by the reference character 600 in accordance with the preferred embodiment. Level shifter circuit 600 includes an input inverter 602 operating in a domain of a first power supply voltage VDDA. The input inverter receives an input signal INPUT and provides a first inverted signal OUTPUT_B. An output inverter 604 operating in a domain of a second power supply voltage VDDB coupled to the input inverter 602 that provides an output signal OUTPUT having a voltage level corresponding to the second voltage supply and a logic value corresponding to the input signal. The second power supply voltage VDDB is higher than the first power supply voltage VDDA.

The input inverter 602 is defined by a series connected P-channel field effect transistor (PFET) 606 and an N-channel field effect transistor (NFET) 608. The output inverter 604 is defined by a series connected PFET 610 and NFET 612 connected between the second power supply voltage VDDB and ground. The input inverter output OUTPUT_B is applied to the output inverter 604 that provides the output signal OUTPUT.

Level shifter circuit 600 includes a leakage current control circuit 614 including a finisher transistor 616 connected between the second power supply voltage VDDB and the input to the output inverter 604 and a path control transistor 618 controlling a path between the first power supply voltage VDDA and the input inverter 602. An even number of series connected inverters are arranged to provide at node FB a gate input to the path control transistor 618. As shown, a pair of series connected inverters are respectively defined by a series connected PFET 620 and NFET 622, and a series connected PFET 624 and NFET 626 is connected between the second power supply voltage VDDB and ground. A common gate input of PFET 620 and NFET 622 is connected to the OUTPUT_B. which provide a gate input to a common gate input of PFET 624 and NFET 626. The inverted output of PFET 624 and NFET 626 at node FB provides the gate input to the path control PFET 618. The finisher PFET 616 has a gate input connected to the OUTPUT.

Operation of the leakage current control circuit 614 of level shifter circuit 600 provides the same overall functions as the leakage current control circuit 414 of level shifter circuit 400.

Figure 7:
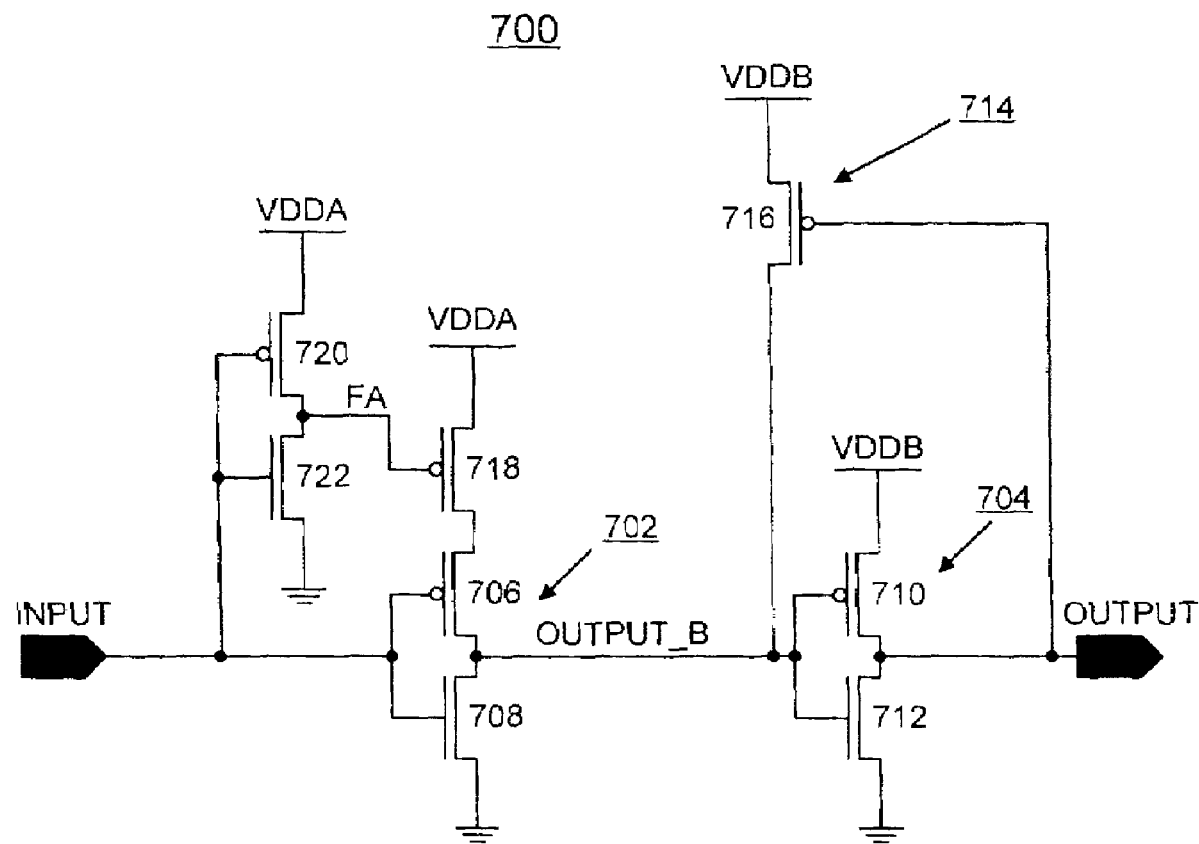

Referring to FIG. 7, there is shown another exemplary level shifter circuit generally designated by the reference character 700 in accordance with the preferred embodiment. Level shifter circuit 700 includes an input inverter 702 operating in a domain of a first power supply voltage VDDA. The input inverter receives an input signal INPUT and provides a first inverted signal OUTPUT_B. An output inverter 704 operating in a domain of a second power supply voltage VDDB coupled to the input inverter 702 that provides an output signal OUTPUT having a voltage level corresponding to the second voltage supply and a logic value corresponding to the input signal. The second power supply voltage VDDB is higher than the first power supply voltage VDDA.

The input inverter 702 is defined by a series connected P-channel field effect transistor (PFET) 706 and an N-channel field effect transistor (NFET) 708. The output inverter 704 is defined by a series connected PFET 710 and NFET 712 connected between the second power supply voltage VDDB and ground. The input inverter output OUTPUT_B is applied to the output inverter 704 that provides the output signal OUTPUT.

Level shifter circuit 700 includes a leakage current control circuit 714 including a finisher transistor 716 connected between the second power supply voltage VDDB and the input to the output inverter 704 and a path control transistor 718 controlling a path between the first power supply voltage VDDA and the input inverter 702. An inverter defined by a series connected PFET 720 and NFET 722 is connected between the first power supply voltage VDDA and ground having a common gate input connected to the INPUT and providing a gate input at a node FA to the path control PFET 718. The finisher PFET 716 has a gate input connected to the OUTPUT.

Operation of the leakage current control circuit 714 of level shifter circuit 700 provides the same overall functions as the leakage current control circuit 414 of level shifter circuit 400.

Figure 8:
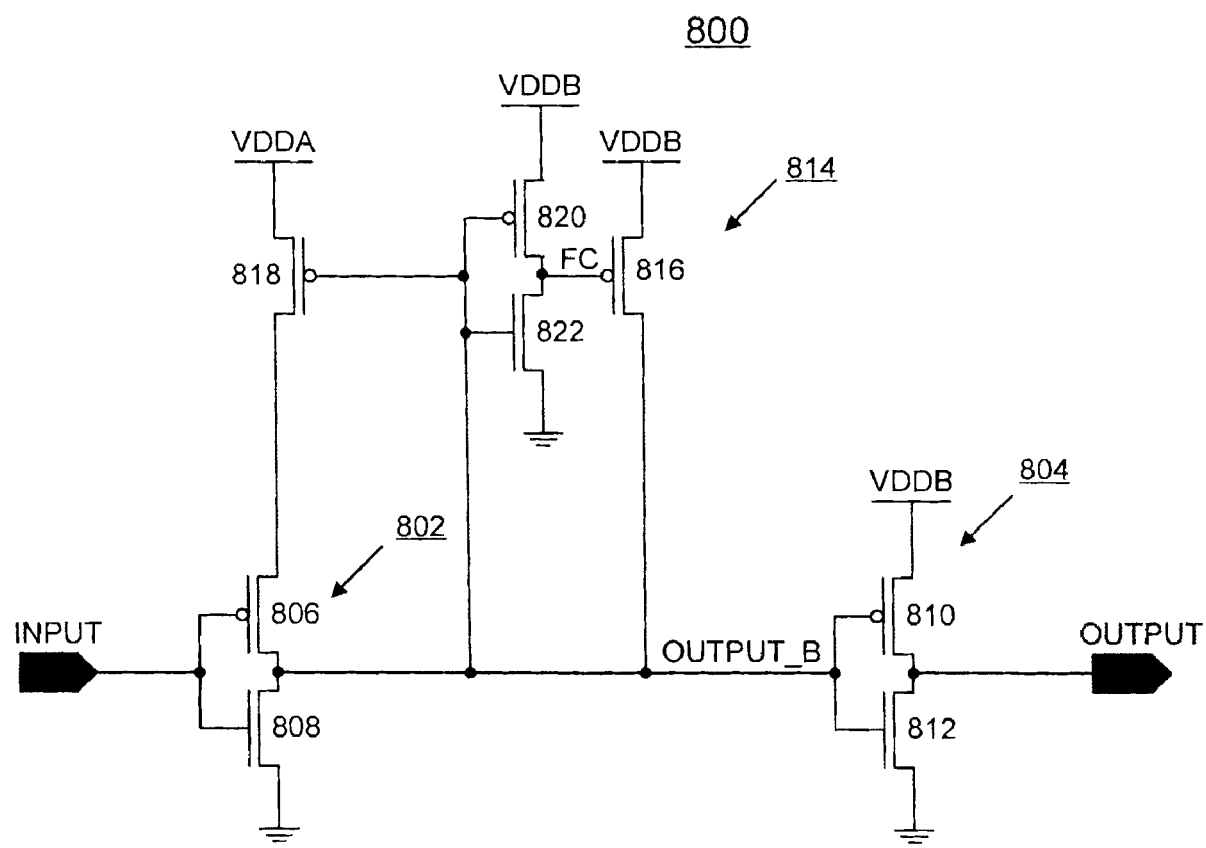

Referring to FIG. 8, there is shown another exemplary level shifter circuit generally designated by the reference character 800 in accordance with the preferred embodiment. Level shifter circuit 800 includes an input inverter 802 operating in a domain of a first power supply voltage VDDA. The input inverter receives an input signal INPUT and provides a first inverted signal OUTPUT_B. An output inverter 804 operating in a domain of a second power supply voltage VDDB coupled to the input inverter 802 that provides an output signal OUTPUT having a voltage level corresponding to the second voltage supply and a logic value corresponding to the input signal. The second power supply voltage VDDB is higher than the first power supply voltage VDDA.

The input inverter 802 is defined by a series connected PFET 806 and NFET 808. The output inverter 804 is defined by a series connected PFET 810 and NFET 812 connected between the second power supply voltage VDDB and ground. The input inverter output OUTPUT_B is applied to the output inverter 804 that provides the output signal OUTPUT.

Level shifter circuit 800 includes a leakage current control circuit 814 including a finisher transistor 816 connected between the second power supply voltage VDDB and the input to the output inverter 804 and a path control transistor 818 controlling a path between the first power supply voltage VDDA and the input inverter 802. An inverter defined by a series connected PFET 820 and NFET 822 is connected between the second power supply voltage VDDB and ground having a common gate input connected to the input inverter output OUTPUT_B and providing a gate input to the finisher PFET 816. The path control transistor 818 has a gate input connected to the input inverter output OUTPUT_B.

Operation of the leakage current control circuit 814 of level shifter circuit 800 provides the same overall functions as the leakage current control circuit 414 of level shifter circuit 400.

Figure 9:
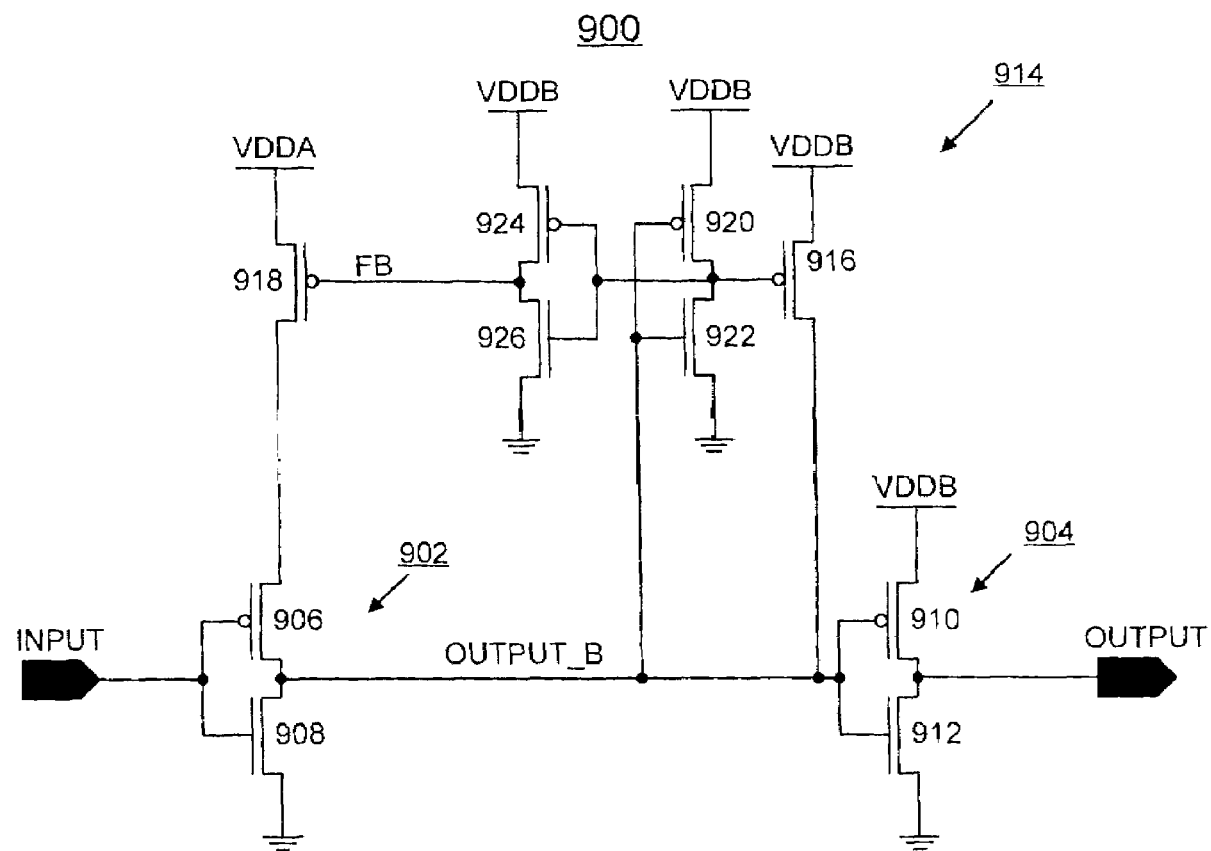

Referring to FIG. 9, there is shown another exemplary level shifter circuit generally designated by the reference character 900 in accordance with the preferred embodiment. Level shifter circuit 900 includes an input inverter 902 operating in a domain of a first power supply voltage VDDA. The input inverter receives an input signal INPUT and provides a first inverted signal OUTPUT_B. An output inverter 904 operating in a domain of a second power supply voltage VDDB coupled to the input inverter 902 that provides an output signal OUTPUT having a voltage level corresponding to the second voltage supply and a logic value corresponding to the input signal. The second power supply voltage VDDB is higher than the first power supply voltage VDDA.

The input inverter 902 is defined by a series connected P-channel field effect transistor (PFET) 906 and an N-channel field effect transistor (NFET) 908. The output inverter 904 is defined by a series connected PFET 910 and NFET 912 connected between the second power supply voltage VDDB and ground. The input inverter output OUTPUT_B is applied to the output inverter 904 that provides the output signal OUTPUT.

Level shifter circuit 900 includes a leakage current control circuit 914 including a finisher transistor 916 connected between the second power supply voltage VDDB and the input to the output inverter 904 and a path control transistor 918 controlling a path between the first power supply voltage VDDA and the input inverter 902. An even number of series connected inverters are arranged to provide at node FB a gate input to the path control transistor 618. As shown, a pair of series connected inverters are respectively defined by a series connected PFET 920 and NFET 922, and a series connected PFET 924 and NFET 926 is connected between the second power supply voltage VDDB and ground. A common gate input of PFET 920 and NFET 922 is connected to the OUTPUT_B, which provide a gate input to a common gate input of PFET 924 and NFET 926. The inverted output of PFET 924 and NFET 926 at node FB provides the gate input to the path control PFET 918. The inverted output of PFET 920 and NFET 922 provides the gate input to the finisher PFET 916.

Operation of the leakage current control circuit 914 of level shifter circuit 900 provides the same overall functions as the leakage current control circuit 414 of level shifter circuit 400.

Figure 10:
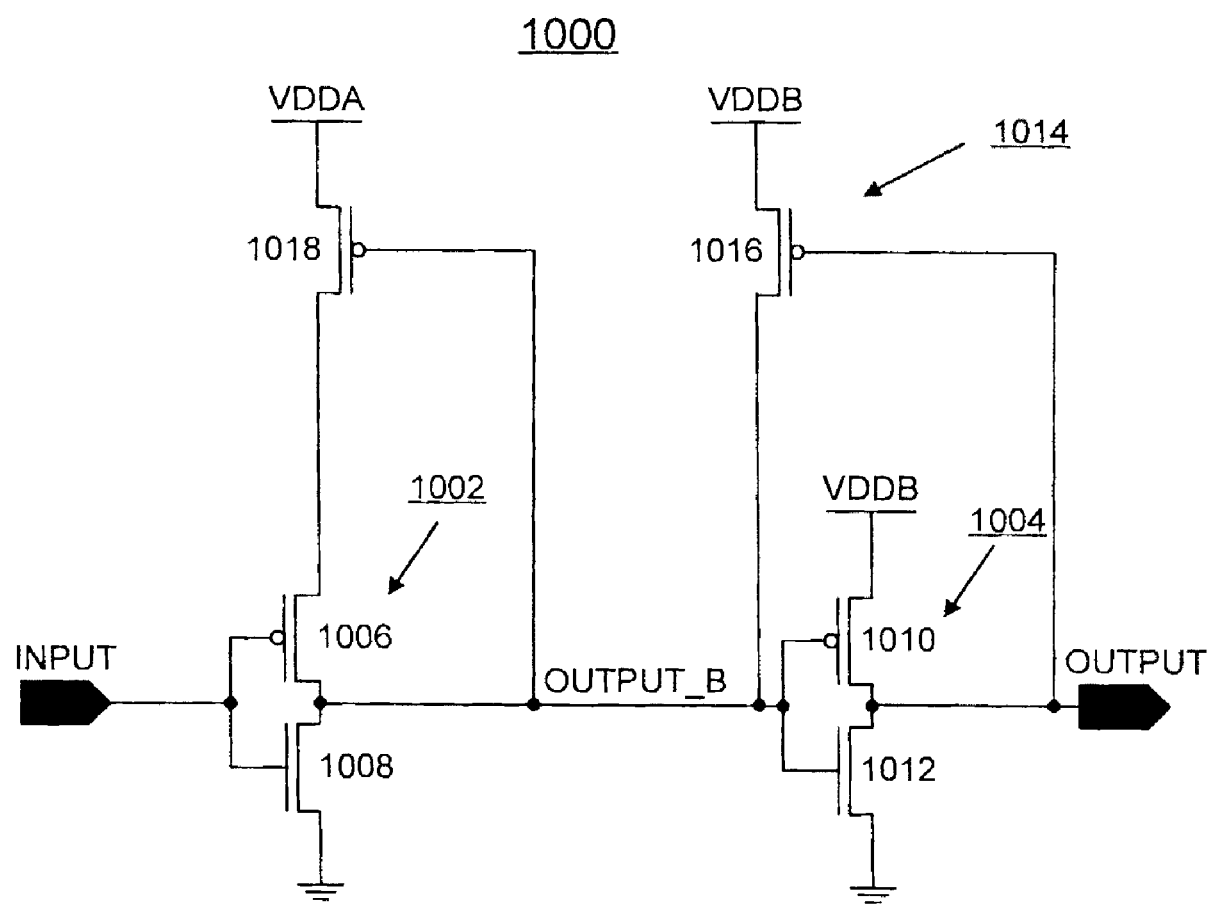

Referring to FIG. 10, there is shown another exemplary level shifter circuit generally designated by the reference character 1000 in accordance with the preferred embodiment. Level shifter circuit 1000 includes fewer devices than the other embodiments of FIGS. 4A, 5, 6, 7, and 9. Level shifter circuit 1000 includes an input inverter 1002 operating in a domain of a first power supply voltage VDDA. The input inverter receives an input signal INPUT and provides a first inverted signal OUTPUT_B. An output inverter 1004 operating in a domain of a second power supply voltage VDDB coupled to the input inverter 1002 that provides an output signal OUTPUT having a voltage level corresponding to the second voltage supply and a logic value corresponding to the input signal. The second power supply voltage VDDB is higher than the first power supply voltage VDDA.

The input inverter 1002 is defined by a series connected PFET 1006 and NFET 1008. The output inverter 1004 is defined by a series connected PFET 1010 and NFET 1012 connected between the second power supply voltage VDDB and ground. The input inverter output OUTPUT_B is applied to the output inverter 1004 that provides the output signal OUTPUT.

Level shifter circuit 1000 includes a leakage current control circuit 1014 including a finisher transistor 1016 connected between the second power supply voltage VDDB and the input to the output inverter 1004 and a path control transistor 1018 controlling a path between the first power supply voltage VDDA and the input inverter 1002. The input inverter output OUTPUT_B is applied to a gate input of the path control transistor 1018. The finisher PFET 1016 has a gate input connected to the OUTPUT.

Operation of the leakage current control circuit 1014 of level shifter circuit 1000 provides the same functions as the leakage current control circuit 414 of level shifter circuit 400.

While the present invention has been described with reference to the details of the embodiments of the invention shown in the drawing, these details are not intended to limit the scope of the invention as claimed in the appended claims.

What is claimed is:

1. A method for implementing voltage level shifters for integrated circuits comprising:

providing an input inverter operating in a domain of a first voltage supply;

said input inverter receiving an input signal and providing a first inverted signal output;

providing an output inverter coupled to said input inverter and operating in a domain of a second voltage supply higher than the first voltage supply; said output inverter providing an output signal having a voltage level corresponding to the second voltage supply and a logic value corresponding to the input signal;

connecting a finisher transistor for leakage current control between the second voltage supply and the input to the output inverter;

connecting a path control transistor for controlling a path between the first voltage supply and the input inverter; and connecting control transistors in series between the first voltage supply and ground, said control transistors defining a second input inverter receiving a common gate input of the input signal; and said control transistors providing a second inverted signal output applied to a gate input to said path control transistor.

2. The method for implementing voltage level shifters as recited in claim 1 includes activating said finisher transistor responsive to a one logic value of the first inverted signal, said finisher transistor providing the voltage level corresponding to the second voltage supply to said output inverter.

3. The method for implementing voltage level shifters as recited in claim 1 includes turning off said finisher transistor responsive to a zero logic value of the first inverted signal.

* * * * *